United States Patent [19]

Johansen et al.

[11] Patent Number: 5,010,054
[45] Date of Patent: Apr. 23, 1991

[54] METHOD FOR THE PREPARATION OF SUPERCONDUCTING PRODUCTS

[75] Inventors: Keld Johansen, Frederikssund; Erik Pedersen, Hørsholm; Haldor F. A. Topsøe, Vedbæk, all of Denmark

[73] Assignee: Haldor Topsoe A/S, Denmark

[21] Appl. No.: 216,895

[22] Filed: Jul. 8, 1988

[30] Foreign Application Priority Data

Jul. 10, 1987 [DK] Denmark ............................ 3581/87

[51] Int. Cl.$^5$ ...................... H01B 12/00; H01L 39/00
[52] U.S. Cl. ........................................ 505/1; 505/704; 505/739; 505/740; 264/65
[58] Field of Search .................... 505/1, 704, 739, 740; 264/65

[56] References Cited

U.S. PATENT DOCUMENTS 4,518,546  5/1985  Greskovich et al. ................. 264/65

FOREIGN PATENT DOCUMENTS 60-165005  8/1985  Japan .
61-223170  10/1986  Japan .
214264  7/1967  Sweden .

OTHER PUBLICATIONS

Koa, "Synthesis of yttrium Larium Copper Oxide Superconductors from $Y_2O_3$, $BaO_2$, $Cu_2O$: the Optional Oxygen Treatment", Mater. Lett., 6(3), 53–7, early 1987.

Larbalestier et al., "Microstructural and Electromagnetic Characterization of $La_{2-x}Sr_xCuO_4$", Mar. 18, 1987, Cryogenics, Aug. 1987.

Robinson et al., "Sinter-Forged $YBa_2Cu_8O_{7-\delta}$", Adv. Cer. Matl., vol. 2, 3D, 380–7, Jul. 1987.

Primary Examiner—William R. Dixon, Jr.
Assistant Examiner—Melissa Bonner
Attorney, Agent, or Firm—Ostrolenk, Faber, Gerb & Soffen

[57] ABSTRACT

Superconducting products on the basis of crystalline superconducting compounds having the general formula $(Me^1)_p(Me^2)_qCu_3O_xF^y$, wherein $Me^1$ is selected from Y, Sc and the lanthanides, $Me^2$ is Ba and/or Sr, p is 0.8–2.5, q is 0.8–3, x is 5–8.5 and y is 0–6, are prepared by reacting oxides of the metals in the molten phase, the $Me^2$ oxides at least in part being used as $Me^2$ peroxide and $Me^1$ oxide and/or Cu oxide optionally being partly replaced by fluorides. The reaction is carried out under an oxygen-free atmosphere in a closed reaction vessel having deformable walls, and during the reaction the vessel is placed in an autoclave under an isostatic pressure of 800 to 3000 bar and at a temperature of 800° to 1400° C., after which cooling is carried out without opening of the vessel. During, between or after the heating and cooling the vessel with its contents is shaped to the desired intermediate product or final product having superconducting properties. Very suitably the reaction vessel may be a copper tube which during, between or after the heating and cooling is drawn to form a superconductor cable.

10 Claims, No Drawings

METHOD FOR THE PREPARATION OF SUPERCONDUCTING PRODUCTS

FIELD AND BACKGROUND OF THE INVENTION

The present invention relates to a method for the preparation of superconducting products on the basis of superconducting compounds having the general formula $(Me^1)_p(Me^2)_qCu_3O_xF_y$, where $Me^1$ is one or more metals selected from yttrium, scandium and the rare earth metals, $Me^2$ is barium and/or strontium, p a number 0.8-2.5, q a number 0.8-3, x a number 5-8.5 and y a number 0-6, in which process oxides and optionally fluorides of $Me^1$, $Me^2$ and Cu are reacted with each other at an elevated temperature.

It is known that metal-oxide ceramic compounds of this kind, which are frequently called Y—Ba—Cu—O and in which the metals are present in the oxidic form, possess superconducting properties at a substantially higher temperature than that known for classic superconductors (up to about 23 K), frequently at a little above the boiling point of liquid nitrogen at atmospheric pressure. It is also known that a partial replacement of oxygen by fluorine may improve the superconducting properties.

Although the metals in compounds of this kind typically are yttrium, barium and copper, yttrium may be entirely or partly replaced by scandium and/or one or more lanthanides, and barium entirely or partly by strontium. In the materials of the kind so far known, copper is compulsory; it is known that the superconducting properties are improved concurrently with the degree to which copper is present at a higher oxidation state than 2, preferably predominantly or entirely in oxidation state 3. Known materials of the kind in question have, for example, the composition $YBa_2Cu_3O_z$, where z is a number 6 to 8, or $La_{1.85}Ba_{0.15}CuO_4$.

Surveys of superconducting substances of the kind in question are, i.a., an article by Ron Dagani in Chemical & Engineering News, May 11, 1987, p.p. 7-16, and by Ib Johannsen and Thomas Bjørnholm in Dansk Kemi 5, May, 1987, p.p. 172-175. There is a bibliography in the latter.

It is known that such compounds can be prepared by a solid phase reaction between suitable compounds, e.g. oxides, carbonates or oxalates, in powder form under an oxygen-containing atmosphere; that the reaction must be conducted under a controlled temperature profile; and that the composition of the surrounding atmosphere is important, notably the partial pressure of oxygen. Hitherto one has always used barium oxide, BaO, and possibly strontium oxide, SrO, as the source of $Me^2$ and conducted the reaction in an oxygen-containing atmosphere, frequently in pure oxygen.

It may hereby be difficult to control the temperature profile and the oxygen pressure of the surrounding atmosphere so closely as to obtain a well-defined product, especially a compound in which Cu is present in a state of oxidation above 2. It might be important to provide another source of oxygen than elemental oxygen from the atmosphere or in an industrailly commonly available pure form.

The known processes for the preparation of Y—Ba—Cu—O compounds have the well-known drawbacks of solid phase reactions, including a slow reaction, difficulties in obtaining the needful contact between the reactants, difficulties in obtaining uniform products having high contents of desired phases and in obtaining a desired crystalline form of desired purity and dimensions, notably in obtaining perfect crystals, monocrystals.

The superconducting crystals prepared by the known processes must frequently be employed not as they are, but must be worked up and shaped to intermediate products or final products, e.g. superconductor cables. Such working up frequently involves complicated and difficult methods.

DISCLOSURE OF THE INVENTION

It has now been surprisingly found that an overall solution of these problems can be obtained if according to the invention the $Me^2$ oxide at least partly is employed as the $Me^2$ peroxide and the oxides, possibly accompanied by fluorides of $Me^1$ and/or Cu, are placed under an oxygen-free atmosphere in a reaction vessel having deformable walls, which vessel is thereafter hermetically closed and placed in an autoclave suitable for hot isostatic pressing (HIP), gradually subjected to a pressure of 800 to 3000 bar and heated to a temperature in the range of 800 to 1400° C. and then cooled without being opened, the vessel with its contents being shaped during, between or after the heating and cooling to form a desired intermediate product or final product having superconducting properties.

When using barium peroxide and/or strontium peroxide as the source of Ba and/or Sr it is obtained that these compounds can also function as oxygen sources and that the reaction can be carried out without any outer oxygen supply. By adjusting the proportion of $Me^2$ peroxide relative to the $Me^2$ oxide it is possible to a considerable degree to regulate the degree to which Cu will be present in the final compound in an oxidation state above 2; by using only $Me^2$ peroxides it is possible at least to approach the theoretical maximum value of x of 8.5; if $Me^1$ and Cu are employed partly as fluorides this maximum value of x must of course be decreased corresponding to the value of y.

Moreover, barium and strontium peroxide as components of the starting material have the advantage of low melting temperatures, 450° C. and 215° C., respectively, whereas the monoxides melt at 1923° C. and 2430° C., respectively. It is thus achieved that the reaction between the starting materials partly can take place in the molten phase, which ensures a better contact between the reactants than that obtained in the known solid phase reactions.

Finally the conducting of the reaction in a deformable vessel ensures that the latter at any time, together with its contents of Y—Ba—Cu—O compound or starting material therefor or any intermediate step of its preparation may be shaped to form an intermediate product or end product having a desired outer shape and being suitable for commercial purposes or for scientific experiments.

Since the liquid phase of the $Me^2$ peroxide allows a high rate of reaction, it involves good possibilities of obtaining perfect monocrystals. When the reaction is carried out under HIP conditions as stated, a high density of matter can be obtained, which may be considered a condition for obtaining a high current density in the finished product. By suitable selection of reaction temperature and temperature gradients, notably during the heating but to a certain degree even during the cooling, it is possible to promote the possibilities of obtaining large monocrystals having a high density of matter.

During the heating the starting materials to some degree are transformed into the gaseous phase. In order to avoid a too high gas pressure in the vessel and to limit the amount of gas in the final product, it may according to the invention be appropriate to evacuate the vessel to a considerable degree before it is hermetically closed.

As mentioned the heating is carried out gradually, and according to the invention it is expedient that the cooling takes place gradually and slowly, e.g. by taking place spontaneously thereby that the heat supply to the autoclave is discontinued and the product removed only when cooling has taken place quite or almost to ambient temperature.

According to the invention the deformable reactor may advantageously be a metal tube, e.g. of copper or a stainless alloy (of a high purity suitable for the purpose) which during, between or after the heating and cooling is drawn to form a superconductor cable.

The autoclave employed must be arranged so as to allow a close temperature regulation in the range from 0° C. to 1100° C., preferably up to 1400° C. The temperature rise should be controlled carefully, especially in the range from somewhat below the melting point of the $Me^2$ peroxide to the final temperature which in the case of using barium peroxide conveniently is around 950° C.

The method according to the invention is to be illustrated by an example in the following.

EXAMPLE

In a mortar 1.13 g (0.005 mol) of $Y_2O_3$, 3.39 g (0.020 mol) of $BaO_2$ and 2.39 g of (0.030 mol) CuO were comminuted thoroughly into powders and were placed in a tube of a supple alloyed steel having a wall thickness of 0.3 mm and an inner diameter of 3.2 mm. After compacting in known manner the tube was closed and placed in an autoclave suitable for hot isostatic pressing and adapted to temperature control within the range of 0 to 1400° C. The tube with its contents was subjected in the autoclave to a pressure of 2600 bar, generated by the compression of nitrogen, and then gradually heated to 915° C. during which the heating from 300° C. to 915° C. took place at a rate of about 143° C. per hour. The temperature of 915° C. and the pressure of 2600 bar were maintained for 3 hours, after which the tube with contents was cooled spontaneously by discontinuing the heat supply to the autoclave.

The product formed has superconducting properties (a clear Meissner effect) and permits a current density of above 1000 $A/cm^2$.

What is claimed is:

1. In a method for the preparation of a superconducting product on the basis of superconducting compounds having the general formula $(Me^1)_p(Me^2)_qCu_3O_x$, where $Me^1$ is at least one metal selected from the group consisting of yttrium, scandium and the lanthanides, $Me^2$ is at least one of the metals barium and strontium, p is a number from 0.8 to 2.5, q is a number from 0.8 to 3 and x is a number from 6 to 8.5, in which process oxides of $Me^1$, $Me^2$ and Cu are reacted with each other at an elevated temperature,
   wherein the improvement comprises
   (i) employing an oxide of $Me^2$ at least partly as the $Me^2$ peroxide,
   (ii) placing the oxides under an oxygen-free atmosphere in a reaction vessel having deformable walls,
   (iii) closing the vessel hermetically and placing it with its contents in an autoclave suitable for hot isostatic pressing, gradually subjecting it to a pressure of 800 to 3000 bar, heating it to a temperature in the range of 800 to 1400° C. and then cooling it without opening it, and
   (iv) shaping the vessel with its contents at any time from the beginning of the heating procedure to the end of the cooling in order to form a desired product having superconducting properties.

2. A method according to claim 1, wherein gases are evacuated from the vessel before it is closed hermetically.

3. A method according to claim 1, wherein the cooling takes place spontaneously.

4. A method according to claim 3, wherein after the completion of the heating, the heat supply to the autoclave is discontinued to allow spontaneous cooling in the autoclave of the vessel with its contents.

5. A method according to claim 1, wherein the reaction vessel having deformable walls is a copper tube which is heated to a temperature of between 800° C. and 1100° C. and drawn to form a superconductor cable.

6. In a method for the preparation of a superconducting product on the basis of superconducting compounds having the general formula $(Me^1)_p(Me^2)_qCu_3O_xF_y$, where $Me^1$ is at least one metal selected from the group consisting of yttrium, scandium and the lanthanides, $Me^2$ is at least one of the metals barium and strontium, p is a number from 0.8 to 2.5, q is a number from 0.8 to 3, x is a number from 6 to 8.5 and y is a number greater than 0 to 6, in which process oxides and fluorides of $Me^1$, $Me^2$ and Cu are reacted with each other at an elevated temperature,
   wherein the improvement comprises
   (i) employing an oxide of $Me^2$ at least partly as the $Me^2$ peroxide,
   (ii) placing the oxides together with at least one fluoride selected from the group consisting of fluorides of $Me^1$ and Cu under an oxygen-free atmosphere in a reaction vessel having deformable walls,
   (iii) closing the vessel hermetically and placing it with its contents in an autoclave suitable for hot isostatic pressing, gradually subjecting it to a pressure of 800 to 3000 bar, heating it to a temperature in the range of 800 to 1400° C. and then cooling it without opening it, and
   (iv) shaping the vessel with its contents at any time from the beginning of the heating procedure to the end of the cooling in order to form a desired product having superconducting properties.

7. A method according to claim 6, wherein gases are evacuated from the vessel before it is closed hermetically.

8. A method according to claim 6, wherein the cooling takes place spontaneously.

9. A method according to claim 8, wherein after the completion of the heating, the heat supply to the autoclave is discontinued to allow spontaneous cooling in the autoclave of the vessel with its contents.

10. A method according to claim 6, wherein the reaction vessel having deformable walls is a copper tube which is heated to a temperature of between 800° C. and 1100° C. and drawn to form a superconductor cable.

* * * * *